United States Patent [19]

Watanabe et al.

[11] Patent Number: 4,799,968
[45] Date of Patent: Jan. 24, 1989

[54] PHOTOVOLTAIC DEVICE

[75] Inventors: Kaneo Watanabe, Kyoto; Masayuki Iwamoto, Hyogo; Koji Minami, Osaka, all of Japan

[73] Assignee: Sanyo Electric Co., Ltd., Japan

[21] Appl. No.: 99,347

[22] Filed: Sep. 21, 1987

[30] Foreign Application Priority Data

Sep. 26, 1986 [JP] Japan .............................. 61-228796
Jun. 3, 1987 [JP] Japan .............................. 62-139232

[51] Int. Cl.$^4$ .......................................... H01L 31/06
[52] U.S. Cl. ........................................ 136/258; 357/30; 357/59
[58] Field of Search .......... 136/258 AM; 357/2, 30 J, 357/30 K, 59 C

[56] References Cited

U.S. PATENT DOCUMENTS

| 4,376,688 | 3/1983 | Caesar et al. | 204/192.11 |
| 4,385,199 | 5/1983 | Hamakawa et al. | 136/258 AM |
| 4,533,450 | 8/1985 | Moustakas | 204/192.26 |
| 4,637,869 | 1/1987 | Glocker et al. | 204/192.11 |

Primary Examiner—Aaron Weisstuch
Attorney, Agent, or Firm—Darby & Darby

[57] ABSTRACT

A photovoltaic device comprises a semiconductor layer of hydrogenated amorphous silicon for photoelectric conversion, in which the proportion of silicon atoms bonded to two hydrogen atoms to all the silicon atoms is not more than 1%.

6 Claims, 4 Drawing Sheets ized by the initial value, with respect to the light
PHOTOVOLTAIC DEVICE

BACKGROUND OF THE INVENTION

1. Field of the Invention

This invention relates to a photovoltaic device for converting optical energy into electric energy and more particularly to a photovoltaic device composed mainly of an amorphous semiconductor film.

2. Description of the Prior Art

It is known that a photovoltaic device can be composed mainly of a photoelectrically active layer of a hydrogenated amorphous semiconductor containing silicon. Such a device can be manufactured with its larger area at a lower cost and thus it is preferable for a large-scaled solar battery. However, it is also known that the photoelectric conversion efficiency of the photovoltaic deivce of hydrogenated amorphous semiconductor is lower than that of a photovoltaic device of crystalline semiconductor and it is degraded after intense light irradiation for a long time (refer to the Japanese patent Laying-Open Gazette No. 59-54274).

SUMMARY OF THE INVENTION

In view of the prior art, it is an object of the present invention to provide a photovoltaic device of hydrogenated amorphous semiconductor which is improved in resistance to light-induced degradation of the conversion efficiency.

It is another object of the present invention to provide a photovoltaic device which is improved in initial conversion efficiency.

According to an aspect of the present invention, a photovoltaic device comprises a semiconductor layer of hydrogenated amorphous silicon for photoelectric conversion, in which the proportion of silicon atoms bonded to two hydrogen atoms to all the silicon atoms is not more than 1%.

According to another aspect of the present invention, a photovoltaic device comprises a semiconductor layer of hydrogenated amorphous silicon for photoelectric conversion which includes a sub-layer on its light facing side wherein the proportion of silicon atoms bonded to two hydrogen atoms to all the silicon atoms is not less than 8% in the sub-layer and not more than 1% in the remaining region.

According to a further aspect of the present invention, a method for depositing a hydrogenated amorphous silicon layer on a substrate comprises the steps of: placing the substate in a reaction chamber, reducing the pressure in the reaction chamber by using an evacuating means, introducing a source gas containing silicon into the reaction chamber, generating radicals containing hydrogen, and introducing the radicals into the reaction chamber, whereby the hydrogenated amorphous silicon layer is deposited on the substrate by chemical reaction of the source gas with the radicals.

According to a still further aspect of the present invention, an apparatus for depositing a hydrogenated amorphous silicon layer on a substrate comprises a reaction chamber in which the substrate is to be placed, evacuating means for reducing the pressure in the reaction chamber, means for introducing a source gas containing silicon into the reaction chamber, means for generating radicals containing hydrogen, and means for introducing the radicals into the reaction chamber, whereby the hydrogenated amorphous silicon layer is deposited on the substrate by chemical reaction of the source gas with the radicals.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
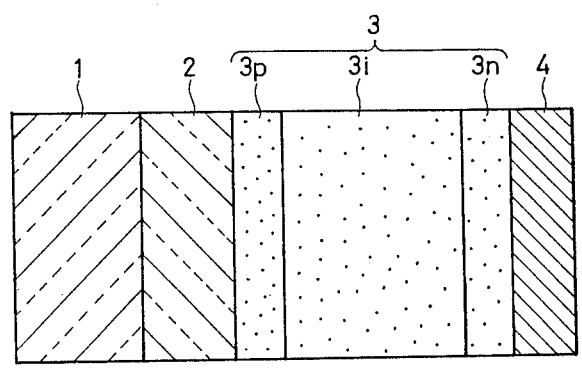
FIG. 1 is a schematic sectional view of a photovoltaic device according to an embodiment of the present invention.

Referring to FIG. 1, a light incident front electrode 2 of a single layer or stacked layers of TCOs (transparent conductive oxide) such as ITO (indium tin oxide) and SnO$_2$, a semiconductor film 3 made mainly of hydrogenated amorphous silicon for receiving incident light through the front electrode, and a back electrode 4 of a single layer or stacked layers of Al, Ti, TCO, etc., are arranged in this order on a substrate 1 of a transparent insulator such as glass.

The semiconductor film 3 comprises a p-layer 3p, an i-layer 3i and an n-layer 3n stacked in this order on the transparent front electrode 2 thereby forming a p-i-n junction. The p-layer 3p may be made of hydrogenated amorphous silicon carbide (a-SiC:H) doped with a p-type dopant and having a wide energy band gap, and it acts as a so-called window layer. The i-layer 3i, which is most active photoelectrically, may be made of non-doped hydrogenated amorphous silicon (a-Si:H) and it mainly generates pairs of free electrons and positive holes as electric charge carriers upon receiving light irradiation through the p-layer 3p. The n-layer 3n may be made of a-Si:H doped with an n-type dopant.

The most important feature of this embodiment resides in that the proportion of silicon atoms bonded to two hydrogen atoms to all the silicon atoms in the i-layer 3i of a-Si:H is not more than 1%. The proportion of Si-H$_2$ bonding can be determined by SIMS (secondary ion mass spectrometry).

Figure 2:
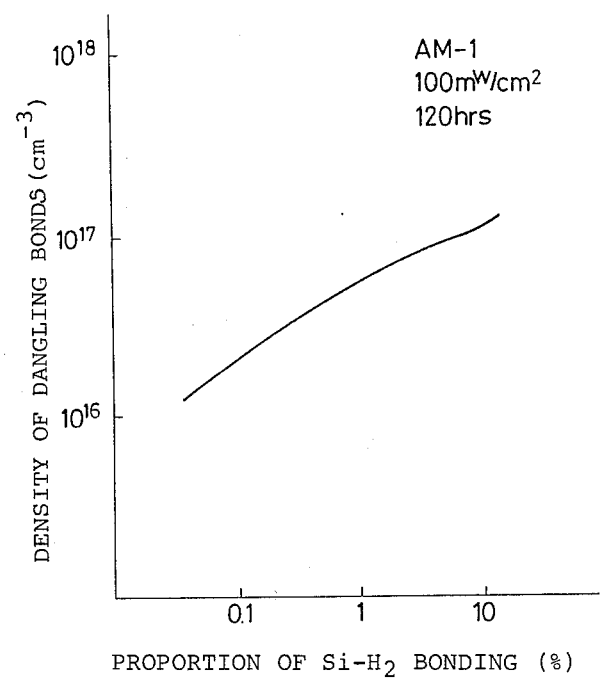
FIG. 2 is a graph showing the density of dangling bonds after the light irradiation test, with respect to the proportion of Si-H$_2$ bonding.

Referring to FIG. 2, there is shown the density of dangling bonds in the i-layer 3i after the light irradiation test with a solar simulator under the irradiation condition of AM-1 solar spectrum on the equator at an intensity of 100mW/cm$_2$ for 120 hours, with respect to the proportion of Si-H$_2$ bonding. It is seen in this figure that the density of dangling bonds after the irradiation test has a positive interrelation with the proportion of Si-H$_2$ bonding. Further, it was found in the irradiation test that the density of dangling bonds is largely increased from an initial value of about $1\times 10^{15}$-$2\times 10^{16}$cm$^{-3}$ to a value of about $10^{17}$cm$^{-3}$ after the irradiation test in the case where the proportion of Si-H$_2$ bonding is 10%. Such increase in the density of dangling bonds incurs deterioration in the quality of the i-layer and thus the conversion efficiency is degraded by the intense lght irradiation over a long time period.

Figure 3:
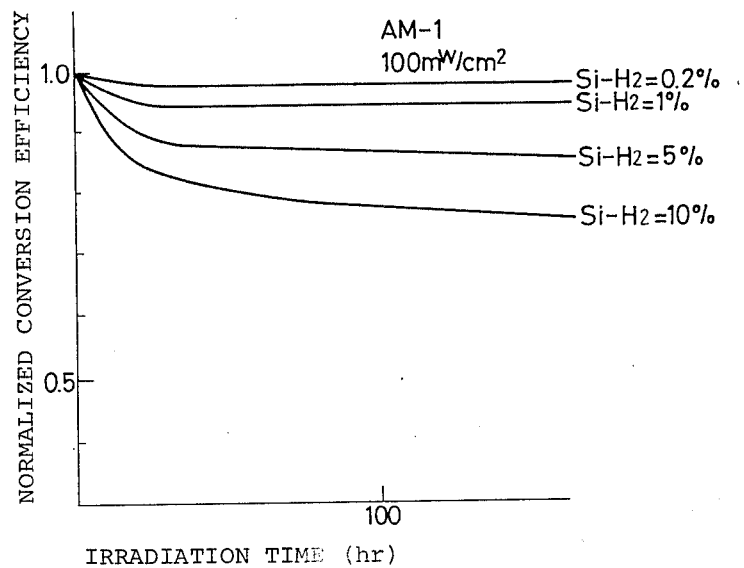
FIG. 3 is a graph showing the conversion efficiency normalized by the initial value, with respect to the light irradiation time.

Referring to FIG. 3, there are shown degradation curves of the conversion efficiency with the passage of time in such devices as shown in FIG. 1 having various proportions of Si-H$_2$ bonding in the respective i-layer $3i$, under AM-1 irradiation at 100mW/cm$^2$. In this figure, the degradation curves are normalized by their respective initial values of the conversion efficiency.

In the meantime, although the active i-layer of a-Si:H can be deposited by various CVD methods, a sputtering method or the like, it is conventionally produced on a commercial basis by a plasma CVD method involving RF (radio frequency) glow discharge. It is known that hydrogen is contained in the deposited films as a terminator of dangling bonds in the concentration range of about 10–30at.% in a-Si:H deposited by such a plasma CVD method. Namely, the hydrogen forms Si-H bonding, Si-H$_2$ bonding, and/or Si-H$_3$ bonding in the deposited i-layer, and the proportion of Si-H$_2$ bonding is usually in the range of more than 1% to more than 10%.

Figure 4:
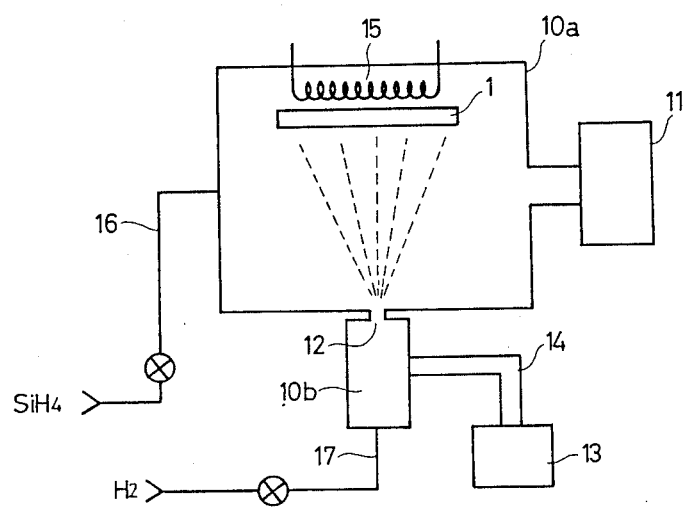
FIG. 4 is a block diagram showing a radical-induced CVD (chemical vapor deposition) apparatus suitable for fabricating a photovoltaic device according to the present invention.

In accordance with the result of the irradiation test as shown in FIGS. 2 and 3, when the proportion of Si-H$_2$ bonding is not more than 1%, more preferably not more than 0.5% and most preferably not more than 0.2%, the density of dangling bonds is not so increased even after light irradiation for a long time period and thus the light-induced degradation of the conversion efficiency is suppressed. Referring to FIG. 4, there is shown a conceptual view of a radical-induced CVD apparatus which utilizes microwave energy and is suitable for depositing the active i-layer $3i$ of a-Si:H having the proportion of Si-H$_2$ bonding not more than 1%. A reaction chamber $10a$ is provided with a heater 15 for heating a substrate 1 and can be evacuated to a high vacuum by a vacuum pump 11. The reaction chamber $10a$ is supplied through a pipe line 16 connected to a side wall thereof with a source gas of monosilane (SiH$_4$) or the like containing silicon and may also be supplied with a dopant gas if desired. A sub-chamber $10b$ is connected to the reaction chamber $10a$ through an orifice 12 opened at the bottom of the reaction chamber $10a$. Hydrogen gas is introduced into the sub-chamber $10b$ through a pipe line 17 and excited to form hydrogen radicals by microwave energy. The microwave energy, e.g., of 2.45GHz, is introduced into the sub-chamber $10b$ through a wave guide 14 from a microwave source 13 such as a magnetron. The hydrogen atoms excited in the sub-chamber $10b$ are discharged through the orifice 12 into the reaction chamber $10a$.

With this radical-induced CVD apparatus, a substrate 1 is placed at the upper portion of the reaction chamber $10a$ opposite the orifice 12 and heated to a prescribed temperature by the heater 15. In the reaction chamber $10a$, the introduced source gas containing silicon is decomposed due to reactive collisions with the excited hydrogen atoms and then gradually deposits a film of hydrogenated amorphous semiconductor such as a-Si:H on the heated substrate 1. The deposition is typically carried out under the conditions in which the substrate temperature is 150–300° C.; the microwave energy is 10–500 W; and the reaction pressure is 1–10 mTorr. When a layer of a-Si:H is deposited, the reaction chamber $10a$ is supplied with the source gas of SiH$_4$ at a flow rate in the range of 5–20SCCM (standard cubic centimeter per minute) and the subchamber $10b$ is supplied with H$_2$ gas at a flow rate in the range of 10–50SCCM.

It is believed that the decreased proportion of Si-H$_2$ bonding in the layer deposited by the radical-induced CVD method is due to the reaction pressure being less than 1/10 of that of the conventional plasma CVD method.

Although the active i-layer $3i$ of a-Si:H has been described in the above embodiment, it can also be made of hydrogenated amorphous silicon containing fluorine (a-Si:H:F), hydrogenated amorphous silicon germanium (a-SiGe:H), hydrogenated amorphous silicon germanium containing fluorine (a-SiGe:H:F) or the like and further may contain a small amount of a dopant.

The proportion of Si-H$_2$ bonding of not more than 1% is also preferred in the p-layer $3p$ and/or the n-layer $3n$ for suppressing the light-induced degradation of the conversion efficiency.

Figure 5:
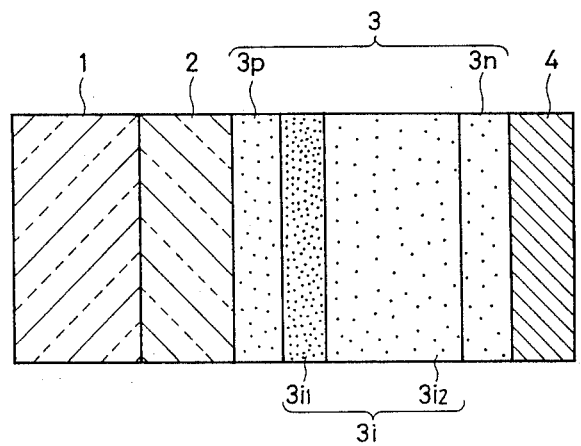
FIG. 5 is a schematic sectional view of a photovoltaic device according to another embodiment of the present invention.

Referring to FIG. 5, there is shown a photovoltaic device according to another embodiment of the present invention. This device is similar to that of FIG. 1, except that the i-layer $3i$ includes an i$_1$-sub-layer $3i_1$ on its light facing side. While the remaining i$_2$-sub-layer $3i_2$ in the i-layer $3i$ has a proportion of Si-H2 bonding of not more than 1%, the i$_1$-sub-layer $3i_1$ has a higher proportion of Si-H$_2$ bonding than the i$_2$-sub-layer $3i_2$. Such an i$_1$-sub-layer can be deposited by the conventional plasma CVD method.

A device as shown in FIG. 5 was prepared in which although an i$_2$-sub-layer $3i_2$ of 5000A thickness was deposited by the radical-induced CVD method, the other layers and sub-layer were deposited by the plasma CVD method under the conditions shown in Table I. The proportion of Si-H$_2$ bonding in the deposited i$_1$-sub-layer $3i_1$ was 12%.

TABLE I

|  | RF Power (W) | Source Gas (SCCM) | Reaction Pressure (Torr) | Layer Thickness (Å) |
| --- | --- | --- | --- | --- |
| P-Layer (3p) | 30 | SiH$_4$:5 B$_2$H$_6$:0.5 CH$_4$:0.5 | 0.1 | 100 |
| I$_1$-Layer (3i$_1$) | 50 | SiH$_4$:100 | 0.5 | 100 |
| N-Layer (3n) | 30 | SiH$_4$:10 PH$_3$:0.3 | 0.1 | 300 |

A conventional photovoltaic device was also prepared similarly, but the whole i-layer thereof was deposited by the plasma CVD method without including any sub-layers under the conditions in which the RF power was 20 W; the flow rate of the source gas of SiH$_4$ was 10SCCM; and the reaction pressure was 0.1Torr. The proportion of Si-H$_2$ bonding in the thus deposited i-layer was 3%.

Table II shows the open-circuit voltage Voc, short-circuit current Isc, fill factor FF and conversion efficiency $\eta$ in the prepared device of FIG. 5 and the prepared conventional device with the light irradiation of AM-1 at the intensity of 100 mW/cm$^2$. As seen in Table II, the device of FIG. 5 is improved in the open-circuit voltage Voc and conversion efficiency $\eta$ as compared with the conventional device.

TABLE II

|  | Voc (V) | Isc (mA/cm$^2$) | FF (%) | $\eta$(%) |
|---|---|---|---|---|
| Device of FIG. 5 | 0.88 | 15.0 | 0.71 | 9.40 |
| Conventional Device | 0.79 | 15.2 | 0.70 | 8.45 |

Figure 6:
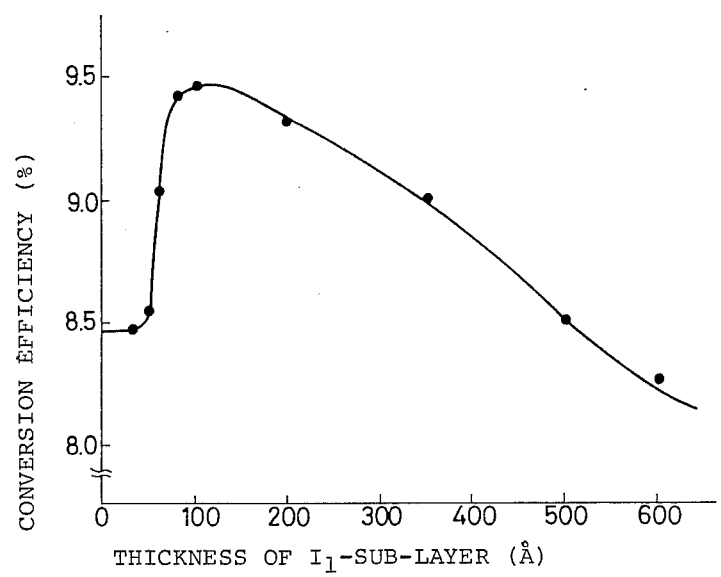
FIG. 6 is a graph showing the conversion efficiency with respect to the thickness of the i$_2$-sub-layer.

Referring to FIG. 6, there is shown the relation between the conversion efficiency $\eta$ and the thickness of the $i_1$-sub-layer $3i_1$. It is found from this figure that the $i_1$-sub-layer $3i_1$ of a thickness in the range of 30–500Å improves the conversion efficiency $\eta$. A more preferred range of thickness is 70–350Å.

Figure 7:
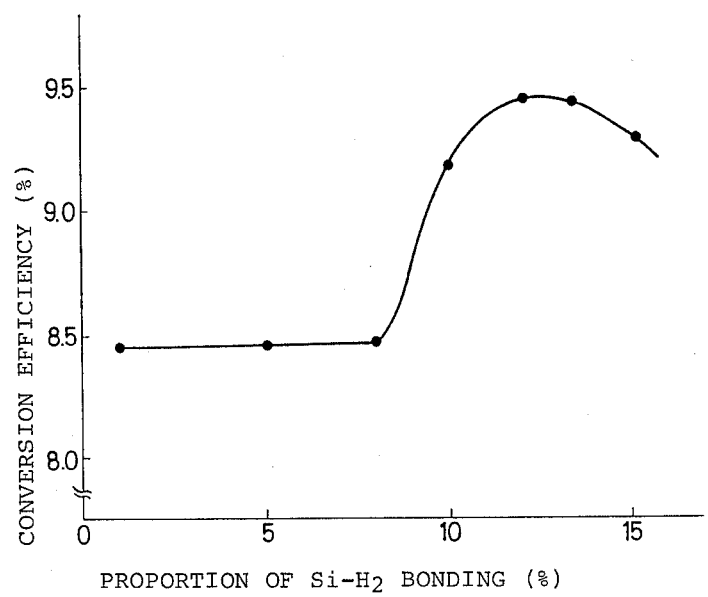
FIG. 7 is a graph showing the conversion efficiency with respect to the proportion of Si-H$_2$ bonding in the i$_2$-sub-layer.

Referring to FIG. 7, there is shown the relation between the conversion efficiency $\eta$ and the proportion of Si-H$_2$ bonding in the $i_1$-sub-layer $3i_1$. As seen from this figure, when the proportion of Si-H$_2$ bonding in the $i_1$-sub-layer $3i_1$ is not less than 8%, the conversion efficiency $\eta$ is improved. The proportion of Si-H$_2$ bonding can be controlled by changing the flow rate of SiH$_4$ and/or the reaction pressure.

Although a uniformly deposited $i_1$-sub-layer $3i_1$ has been described in the above embodiment, the proportion of Si-H$_2$ bonding may be made to be highest on the side contiguous to the p-layer $3p$ and to decrease gradually toward the other side. Further, the p-layer and n-layer may be exchanged with each other.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photovoltaic device comprising a semiconductor layer of hydrogenated amorphous silicon for photoelectric conversion which includes a sub-layer on its light incident side, wherein the proportion of silicon atoms bonded to two hydrogen atoms to all the silicon atoms is not less than 8% in said sub-layer and not more than 1% in the remaining region.

2. A photovoltaic device in accordance with claim 1, wherein the thickness of said sub-layer is in the range of 30–500Å.

3. A photovoltaic device in accordance with claim 2, wherein the thickness of said sub-layer is more preferably in the range of 7–350Å.

4. A photovoltaic device in accordance with claim 1, wherein said semiconductor layer is an i-layer of an intrinsic type.

5. A photovoltaic device in accordance with claim 4 further comprising a semiconductor layer of one conductivity type on a light incident side of said i-layer and a semiconductor layer of the opposite conductivity type on the other side of said i-layer.

6. A photovoltaic device in accordance with claim 5, wherein said layer of said one conductivity type is made of hydrogenated amorphous silicon carbide and said layer of said opposite conductivity type is made of hydrogenated amorphous silicon.

* * * * *